United States Patent
Boyd et al.

(10) Patent No.: US 6,353,249 B1
(45) Date of Patent: Mar. 5, 2002

(54) MOSFET WITH HIGH DIELECTRIC CONSTANT GATE INSULATOR AND MINIMUM OVERLAP CAPACITANCE

(75) Inventors: Diane Catherine Boyd, Lagrangeville, NY (US); Hussein Ibrahim Hanafi, Basking Ridge, NJ (US); Meikei Ieong, Wappingers Falls; Wesley Charles Natzle, New Paltz, both of NY (US)

(73) Assignee: International Businsess Machines Corporation, Armonk, NY (US)

( * ) Notice: Subject to any disclaimer, the term of this patent is extended or adjusted under 35 U.S.C. 154(b) by 0 days.

(21) Appl. No.: 09/866,239

(22) Filed: May 25, 2001

Related U.S. Application Data

(62) Division of application No. 09/503,926, filed on Feb. 14, 2000, now Pat. No. 6,271,094.

(51) Int. Cl.[7] .............................................. H01L 21/76
(52) U.S. Cl. ...................... 257/369; 257/368; 257/327
(58) Field of Search ................................ 438/287, 299, 438/216, 303, 305, 591, 785; 257/368, 369, 327

(56) References Cited

U.S. PATENT DOCUMENTS

| | | | |
|---|---|---|---|
| 5,981,320 A | * 11/1999 | Lee | 438/199 |
| 6,008,095 A | 12/1999 | Gardner et al. | |
| 6,087,231 A | 7/2000 | Xiang et al. | |
| 6,104,069 A | * 8/2000 | Duane et al. | 257/369 |
| 6,140,677 A | * 10/2000 | Gardner et al. | 257/327 |
| 6,188,110 B1 | * 2/2001 | Gardner et al. | 257/368 |
| 6,218,276 B1 | * 4/2001 | Liu et al. | 438/596 |
| 6,265,272 B1 | * 7/2001 | Chen | 438/300 |
| 6,300,172 B1 | * 10/2001 | Ang et al. | 438/149 |

* cited by examiner

Primary Examiner—Charles Bowers
Assistant Examiner—David S Blum
(74) Attorney, Agent, or Firm—Scully, Scott, Murphy & Presser; Marian Underweiser

(57) ABSTRACT

Methods of fabricating metal oxide semiconductor field effect transistor (MOSFET) devices having a high dielectric constant (k greater than 7) gate insulator, low overlap capacitance (0.35 fF/$\mu$m or below) and a channel length (sub-lithographic, e.g., 0.1 $\mu$m or less) that is shorter than the lithography-defined gate lengths are provided. The methods include a damascene processing step and a chemical oxide removal (COR) step. The COR step produces a large taper on a pad oxide layer which, when combined with a high-k gate insulator, results in low overlap capacitance, sort channel lengths and better device performance as compared to MOSFET devices that are formed using conventional Complementary Metal Oxide Semiconductor (CMOS) technologies.

10 Claims, 4 Drawing Sheets

MOSFET WITH HIGH DIELECTRIC CONSTANT GATE INSULATOR AND MINIMUM OVERLAP CAPACITANCE

This application is a divisional of U.S. application Ser. No. 09/503,926 now U.S. Pat. No. 6,271,094 filed on Feb. 14, 2000.

DESCRIPTION

1. Field of the Invention

The present invention relates to semiconductor devices, and in particular to methods of fabricating metal oxide semiconductor field effect transistor (MOSFET) devices having a high dielectric constant (k greater than 7) gate insulator, low overlap capacitance (0.35 fF/$\mu$m or below) and a channel length (sub-lithographic, e.g., 0.1 $\mu$m or less) that is shorter than the lithography-defined gate lengths.

2. Background of the Invention

As MOSFET channel lengths are scaled down to sub-0.1 $\mu$m dimensions and as the-gate oxide thickness is scaled down to below 1.5 nm, tunneling currents larger than 1 A/cm$^2$ will preclude the use of SiO$_2$ as a gate dielectric layer. Therefore, the development of a Complementary Metal Oxide Semiconductor (CMOS) technology which utilizes a high-k gate insulator is a must for the continuing of CMOS scaling into the sub-0.1 $\mu$m regime.

In conventional gate CMOS technologies wherein high-k gate insulators are employed, the activation anneal of the source/drain implants is typically performed after the gate insulator is formed. This limits the anneal temperature to less than 800° C. to prevent degradation of the properties of the high-k insulator. Such low temperature anneals result in partial activation of the source/drain junctions as well as in depletion of the polysilicon gate. Both of the above mentioned characteristics are undesirable since they oftentimes lead to device performance degradation.

Moreover, in conventional gate CMOS technologies, the source/drain extensions must overlap the gate region of the device. This overlap causes capacitance in the device. The greater the overlap of the source/drain extensions with the gate region, the greater the overlap capacitance is. Likewise, if the overlap of the source/drain extensions with the gate is too small, an unreliable MOSFET device may be fabricated.

Another problem associated with conventional gate-CMOS technologies is that the gate is fabricated utilizing lithography and etching. The use of lithography and etching in forming the gate region of the CMOS device provides a MOSFET device whose channel length is in the same order as the lithographic tool. That is, lithography-defined gate length preclude the formation of sub-lithographic devices.

In view of the drawbacks with prior art gate CMOS technologies, there is a continued need to develop new and-improved methods that will permit the fabrication of MOSFET devices that have a high-k gate insulator, low overlap capacitance and a sub-lithographic channel length.

SUMMARY OF THE INVENTION

One object of the present invention is to provide a method of fabricating a highly reliable MOSFET device that contains a high-k dielectric material as the gate insulator of the device.

A further object of the present invention is to provide a method of fabricating a highly reliable MOSFET device that contains a high-k dielectric gate insulator and a low overlap capacitance.

Another object of the present invention is to provide a method of fabricating a highly reliable MOSFET device that has a high-k gate insulator, low overlap capacitance and a short channel length.

A still further object of the present invention is to provide methods of fabricating a highly reliable MOSFET device having low overlap capacitance and a short channel length in which a high-k, low-temperature metal oxide or a high-k, high-temperature metal oxide is employed as the gate insulator of the device.

The term "high k" is used in the present invention to denote a dielectric material that has a dielectric constant greater than Si$_3$N$_4$, i.e., greater than 7.0. More preferably, the term "high k" denotes a dielectric material having a dielectric constant of 15 or above.

The term "low overlap capacitance" is used in the present invention to denote a capacitance of 0.35 fF/$\mu$m or less.

The term "short channel length" is employed in the present invention to denote a gate channel that lies beneath the gate region whose length is 0.1 $\mu$m or less, i.e., sub-lithographic.

The term "high-temperature metal oxide" denotes a metal oxide that does not degrade when subjected to annealing at a temperature of about 950°–1050° C., preferably 1000° C., 10 seconds. Illustrative examples of metal oxides within this class include, but are not limited to: Al$_2$O$_3$ and TiO$_2$.

The term "low-temperature metal oxide" denotes a metal oxide that is converted to a metal or it becomes leaky upon annealing at 950°–1050° C., preferably 1000° C., 10 seconds. Illustrative examples of metal oxides within this class include, but are not limited to: ZrO$_2$, barium titanate, strontium titanate and barium strontium titanate.

These and other objects and advantages can be achieved in the present invention by utilizing a method which includes a damascene processing step for the formation of the gate electrode and a chemical oxide removal (COR) processing step for producing a large taper in the pad oxide layer. When these two processing steps are used in combination with a high-k dielectric material, a MOSFET device having a low overlap capacitance and a short channel length can be fabricated.

In one embodiment of the present invention wherein a high-k, high-temperature metal oxide is employed as the gate insulator, the processing steps of the present invention comprise:

(a) providing a semiconductor structure having a film stack formed on a surface of a substrate, said film stack comprising at least a pad oxide layer formed on said surface of said substrate and a nitride layer formed on said pad oxide layer;

(b) forming a gate hole in said nitride layer stopping on said pad oxide layer;

(c) forming an oxide film on the nitride layer in said gate hole;

(d) etching said oxide film and a portion of said pad oxide layer so as to provide an opening in said gate hole exposing a portion of said substrate, wherein the pad oxide layer is tapered by said etching;

(e) forming a high-k, high-temperature metal oxide layer about said gate hole and on said exposed substrate;

(f) filling said gate hole with a gate conductor;

(g) removing said nitride layer exposing portions of said high-k, high-temperature metal oxide; and (h) completing fabrication of said MOSFET device.

Step (h) includes forming activated source/drain extensions in said substrate beneath said gate conductor; forming spacers on exposed sidewalls of said high-k, high-temperature metal oxide; forming activated source/drain regions in said substrate; and forming silicide regions in portions of said pad oxide layer and in said gate conductor.

In another embodiment of the present invention, wherein a high-k, low-temperature metal oxide is employed as the gate insulator, the processing steps of the present invention comprise:

(i) providing a semiconductor structure having a dummy film stack formed on a surface of a substrate, said dummy film stack comprising at least a pad oxide layer formed on said surface of said substrate, a polysilicon layer formed on said pad oxide layer, and a $SiO_2$ layer formed on said polysilicon layer;

(ii) removing selective portions of said dummy film stack stopping on said pad oxide layer so as to provide a patterned dummy gate region;

(iii) removing said $SiO_2$ layer from said patterned dummy gate region;

(iv) forming activated source/drain extensions in said substrate beneath said dummy gate region;

(v) forming spacers on sidewalls of said dummy gate region;

(vi) forming activated source/drain regions in said substrate;

(vii) forming silicide regions in portions of said pad oxide layer and in said polysilicon layer of said dummy gate region;

(viii) forming an insulator layer surrounding said dummy gate region;

(ix) planarizing said insulator layer stopping at said polysilicon layer in said dummy gate region;

(x) forming an opening so as to expose a portion of said substrate, said opening being formed by removing said polysilicon layer of said dummy gate and by tapering a portion of said pad oxide layer of said dummy gate region;

(xi) forming a high-k, low-temperature metal oxide in said opening; and (xii) filling said opening with a gate conductor, said gate conductor being formed at a low temperature.

An optional planarization process may follow step (xii).

Another aspect of the present invention relates to MOSFET devices that are fabricated utilizing either of the above methods. The MOSFET devices of the present invention are characterized as having a low overlap capacitance and a short channel length. Specifically, the MOSFET devices of the present invention comprise at least a gate region having a high-k gate insulator formed on at least a portion of a tapered pad oxide layer, wherein said gate region further includes a channel whose length is sub-lithographic, preferably 0.1 μm or less.

DETAILED DESCRIPTION OF THE INVENTION

Figure 1A:
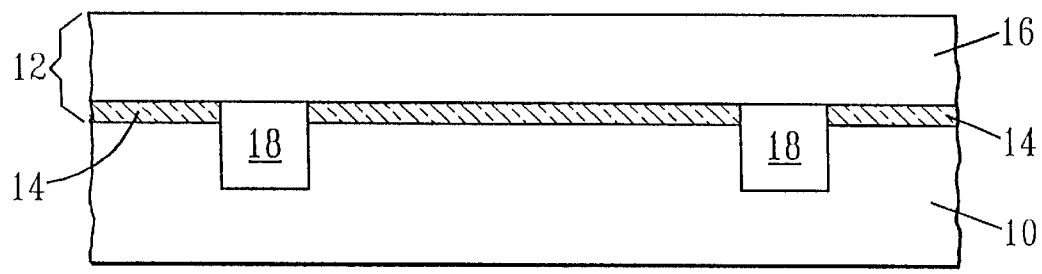
FIGS. 1A–G show a MOSFET device of the present invention through the various processing steps used in the first embodiment of the present invention, i.e., in situations in which a high-k, high-temperature metal oxide is employed.

The present invention which provides methods of fabricating a MOSFET device having a high-k gate insulator, low overlap capacitance and a short channel length will now be described in greater detail by referring to the drawings that accompany the present invention. It should be noted that in the accompanying drawings like reference numerals are used for describing like and/or corresponding elements.

Reference is made to FIGS. 1A–1G which illustrate the basic processing steps that are employed in the first embodiment of the present invention. Specifically, FIGS. 1A–1G are cross-sectional views of one possible MOSFET device that can be formed utilizing the first method of the present invention. As stated above, the first method is employed when a high-k, high-temperature metal oxide is used as the gate insulator.

FIG. 1A shows an initial structure that is formed from step (a) of the present invention. The initial structure comprises a substrate 10 and a film stack 12. The film stack includes a pad oxide layer 14 such as $SiO_2$ which is formed on the surface of substrate 10 and a nitride layer 16 such as $Si_3N_4$ that is formed on the pad oxide layer. Although the drawings of the present invention depict a film stack comprising two material layers, the film stack may also comprise additional material layers. In the embodiment in the drawings of the present invention, nitride layer 16 is different from the nitride layer used in defining the isolation trench, therefore that layer will be removed by a subsequent etching step to expose the gate region of the structure—the pad oxide layer remains on portions of the substrate after removal of the nitride layer.

Pad oxide layer 14 is formed on the surface of substrate 10 using a conventional thermal growing process, or alternatively, the pad oxide layer may be formed by a conventional deposition process such as, but not limited to: chemical vapor deposition (CVD), plasma-assisted CVD, sputtering, evaporation and other like deposition processes. The thickness of the pad oxide layer may vary, but it should be thicker than the corresponding gate insulator which will be formed in a subsequent processing step. Typically, the pad oxide layer has a thickness of from about 8 to about 20 nm.

Insofar as nitride layer 16 is concerned, that layer is formed on the surface of pad oxide layer 14 utilizing conventional deposition processes well known in the art, including the same as mentioned hereinabove in forming the pad oxide layer. The thickness of the nitride layer may vary, but it should be thicker than the pad oxide in which it is formed thereon. Typically, in the present invention, nitride layer 16 of film stack 12 has a thickness of from about 50 to about 200 nm.

The substrate employed in the present invention may be any conventional semiconductor substrate in which a semiconducting material such as silicon is present therein. Examples of some substrates that may be employed in the present invention include, but are not limited to: Si, Ge, SiGe, GaP, InAs, InP and all other III/V compound semiconductors. The substrate may also be composed of a layered semiconductor such as Si/SiGe. The substrate may be of the n-type or p-type depending on the desired device to be fabricated. The substrate may contain various active and/or isolation regions either formed on the substrate or formed in the substrate using processing techniques that are well known in the art. A preferred substrate employed in the present invention is a Si wafer or chip.

Prior to forming film stack 12 on substrate 10, isolation trenches are formed in the substrate. The isolation trenches are formed through a previously deposited nitride layer (that is different from nitride layer 16), pad oxide layer 14 and a portion of substrate 10. Isolation trenches are formed using conventional lithography and etching (reactive-ion etching (RIE), plasma etching, ion beam etching and other like dry etch processes). Although not shown in the drawings, the lithography step employs a conventional photoresist and optionally an anti-reflective coating, both of which are removed after the isolation trenches have been formed in the structure.

An oxide liner, e.g., $SiO_2$, is formed in the isolation trenches so as to line the sidewalls and bottom of each trench and then the trench is filled with a trench dielectric material (In the drawings, isolation regions 18 are meant to include both the oxide liner as well as the trench dielectric material). An optional densification step and/or a planarization step may follow the trench fill. The structure which is formed after isolation trench fill, planarization and film stack 12 formation is shown in FIG. 1A. It should be noted that the oxide liner forms a continuous layer with the top surface of the pad oxide; therefore, the entire bottom portion of the isolation trench is isolated from substrate 10.

The oxide liner may be formed using any conventional deposition or thermal growing process including the same as mentioned hereinabove in forming pad oxide layer 14. The thickness of the oxide liner may vary depending on the processing technique used in forming the same, but a typical thickness range of the oxide liner is from about 5 to about 20 nm.

After the bottom portions of the isolation trenches have been lined with the oxide liner, a trench dielectric material is formed on the surface of the previously formed nitride layer and in isolation trenches. The filling process employed in the present invention comprises any conventional deposition process including, but not limited to: CVD and plasma-assisted CVD. Suitable trench dielectric materials that may be employed in this step of the present invention include: any conventional dielectric material. Examples of some suitable trench dielectric materials that can be used in the present invention include, but are not limited to: tetraethylorthosilicate (TEOS), $SiO_2$, flowable oxides and other like dielectric materials. When TEOS is used as the trench dielectric material, an optional densification step may be employed prior to planarization.

The planarization process comprises any conventional planarization technique known to those skilled in the art including, but not limited to: chemical-mechanical polishing (CMP) and grinding. After forming the isolation regions, the nitride layer may be removed and a new nitride layer 16 is formed, or alternatively additional nitride material is deposited forming a new nitride layer 16.

Figure 1B:
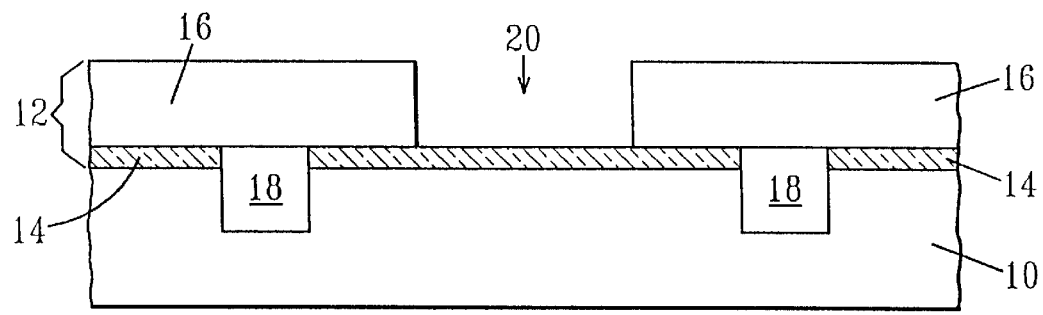

The next step of the first method of the present invention includes the formation of gate hole 20 in nitride layer 16 stopping on pad oxide 14, See FIG. 1B. Specifically, the gate hole is formed utilizing conventional lithography and etching (reactive-ion etching (RIE), plasma-etching, ion beam etching and other like dry etching processes) providing the structure shown in FIG. 1B. A conventional photoresist is employed in defining the gate hole and is removed after fabricating the same. Although the drawings depict the formation of only one gate hole in the structure, a plurality of gate holes are also contemplated herein.

Following gate hole formation, an optional threshold adjust implant step may be performed utilizing conventional ion implantation and an activation anneal; both of these processes are well known to those skilled in the art.

Figure 1C:
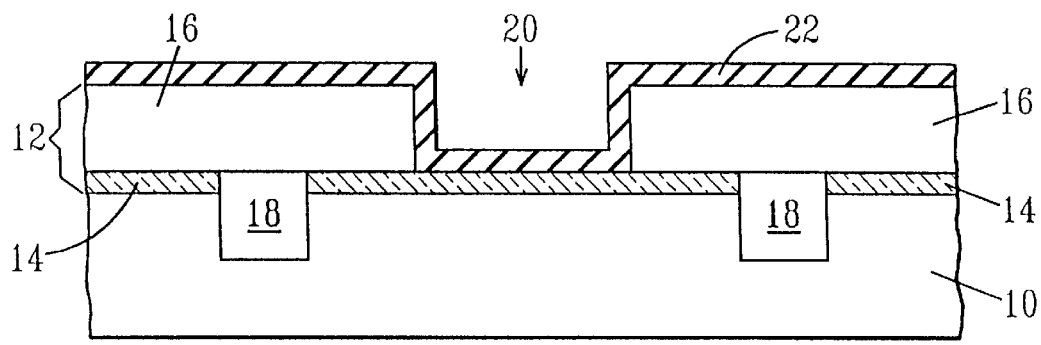

After gate hole formation and optional threshold adjust implant formation, an oxide film 22 is formed on the nitride layer in gate hole 20 providing the structure shown in FIG. 1C. The oxide layer is formed by utilizing a deposition process such as CVD that is capable of forming a layer of oxide on the nitride layer within the gate hole. The oxide is composed of a conventional material such as TEOS.

Figure 1D:
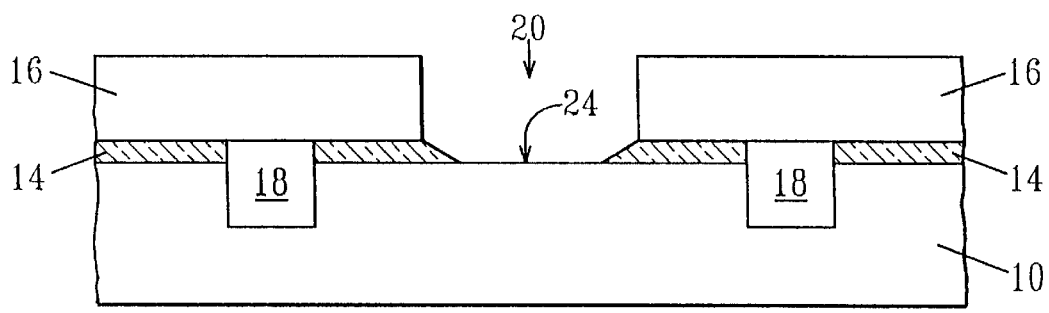

Next, as is shown in FIG. 1D, an opening 24 is formed in pad oxide layer 14 in the bottom of gate hole 20 so as to provide a tapered pad oxide layer in the gate hole. By "taper" it is meant the sidewalls of the pad oxide are not vertical. Rather, the sidewalls of the pad oxide deviate significantly from 90°. Preferably, the sidewalls of the tapered pad oxide are about 45° or less. The tapering is provided in the present invention by utilizing a chemical oxide removal (COR) step which is highly selective in removing oxide. This step of the present invention exposes a portion of substrate 10 in the gate hole by tapering the pad oxide layer while completely removing the oxide layer that was previously formed on the nitride layer within the gate hole. The COR step is a vapor phase chemical oxide removal process wherein a vapor of HF and $NH_3$ is employed as the etchant and low pressures (6 millitorr or below) are used.

After tapering the pad oxide layer in the gate hole, a high-k, high-temperature metal oxide layer 26 (See FIG. 1E) is formed about the gate hole (including the tapered pad oxide layer and the exposed surface of the substrate). The high-k, high-temperature metal oxide is formed utilizing a conventional deposition process including, but not limited to: CVD, plasma-assisted CVD, atomic layer deposition, sputtering and other like deposition processes. As stated above, the high-k, high-temperature material includes any metal oxide that does not degrade when it is annealed at 950°–1050° C., preferably at 1000° C., for 10 seconds. Examples of some high-k, high-temperature metal oxides that can be employed in the present invention include: $Al_2O_3$ and $TiO_2$.

The thickness of the high-k, high-temperature dielectric material is not critical to the present invention, but typically the thickness of the high-k, high-temperature dielectric is from about 5 to about 30 Å.

Figure 1E:
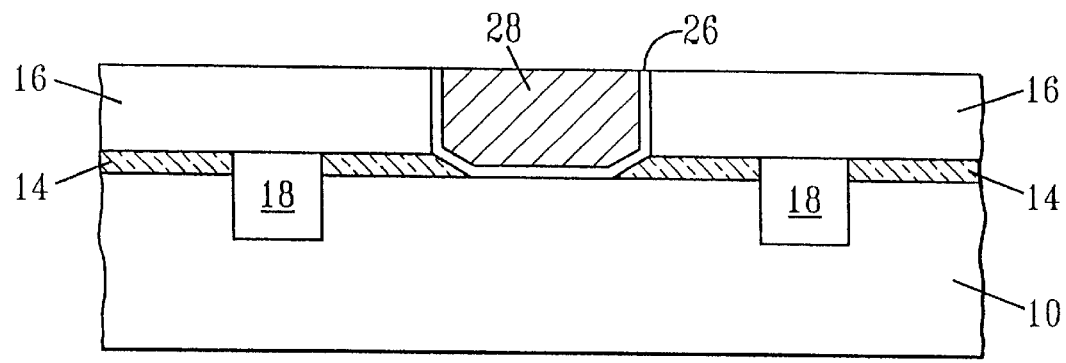

Following formation of the high-k, high-temperature metal oxide, the gate hole is filled with a gate conductor 28 utilizing conventional deposition processes well known to those skilled in the art such as CVD, plasma-assisted CVD, evaporation and sputtering. Suitable gate conductors that can be employed in the present invention include, but are not limited to: polysilicon, W, Ta, TiN and other like conductive materials. The structure including the gate conductor is also shown in FIG. 1E. If needed, a conventional planarization process is used after filling the gate hole with the gate conductor.

Figure 1F:
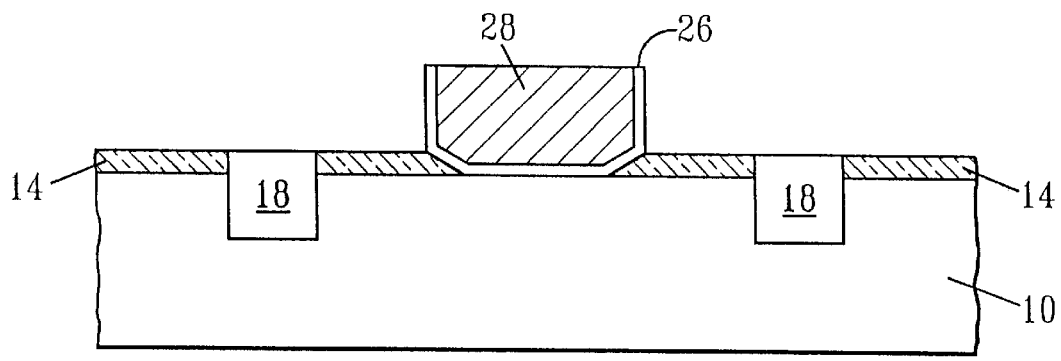

Next, as shown in FIG. 1F, nitride layer 16 is removed from the structure utilizing a conventional damascene etch back process. Specifically, a chemical etchant, such as hot phosphoric acid, that is highly selective in removing nitride as compared to the other surrounding materials layers is employed in the damascene etch back process; the damascene etch back process employed in the present invention stops on the pad oxide layer mentioned above.

Figure 1G:
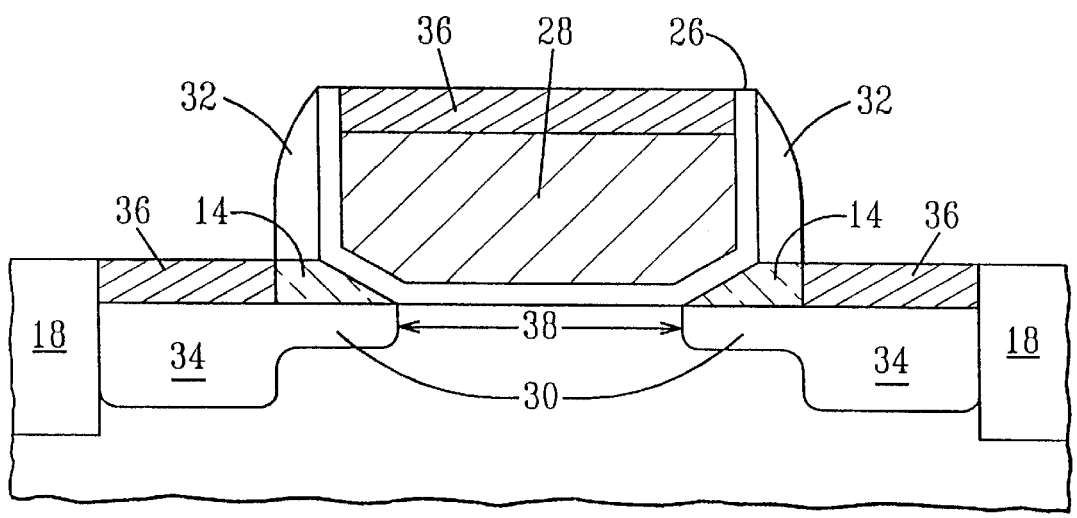

Following removal of nitride layer 16, other regions that are typically present in MOSFET devices are fabricated utilizing techniques that are well known to those skilled in the art. One completed MOSFET device of the present invention is shown in FIG. 1G which is a blown up view about the MOSFET device region. Specifically, FIG. 1G includes: source/drain extensions 30, spacers 32, source/drain regions 34 and silicide regions 36. The source/drain extensions are formed utilizing conventional ion implantation and annealing. The annealing temperature used in activating the source/drain extensions is typically about 950° C. or above, and the annealing time is typically about 5 seconds or below.

Spacers 32 are composed of any conventional nitride (e.g., $Si_3N_4$) or oxide (e.g., $SiO_2$) and are formed utilizing conventional deposition processes well known in the art and then they are etched by RIE or another like etch process. The thickness of spacers 32 may vary, but typically they have a thickness of from about 100 to about 150 nm.

Source/drain regions 34 are formed by conventional ion implantation and annealing. The anneal temperature used in activating the source/drain regions is typically about 1000° C. or above, for a time period of about 5 seconds or less.

The silicide regions are formed in the structure utilizing conventional silicide processing steps that are well known to those skilled in the art. Since such processing steps are well known, a detailed description of the same is not provided herein.

The structure shown in FIG. 1G may then be subjected to other conventional CMOS processing steps which are well known in the art and are described, for example, in R.Colclaser, "Micro Electronics processing and Device Design, Chapter 10, pages 266–269, John Wiley and Sons publisher, 1980.

The above description and FIGS. 1A–1G illustrate a method of the present invention wherein a high-k, high-temperature metal oxide is employed as the gate insulator. The following description and FIGS. 2A–2F illustrate a method of the present invention when a high-k, low-temperature metal oxide is employed as the gate insulator. It is noted that the second embodiment shown in FIGS. 2A–2F represents a preferred embodiment of the present invention.

Figure 2A:
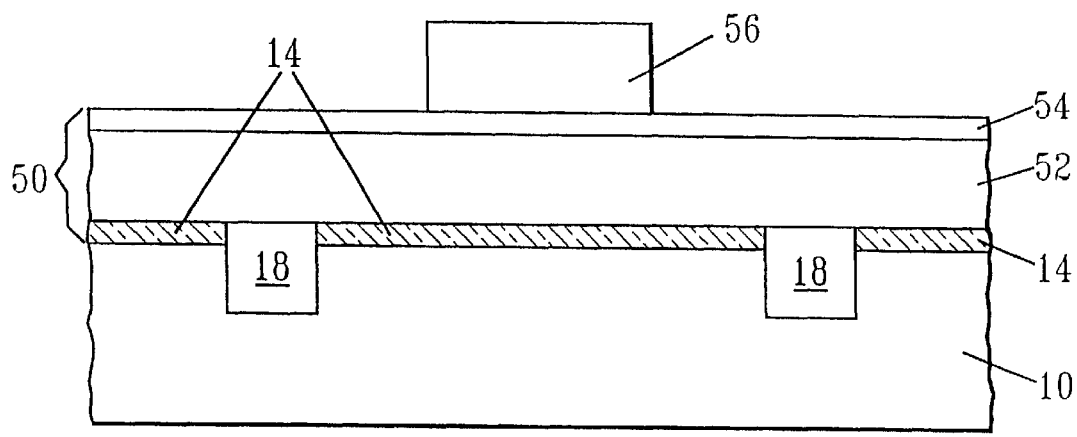
FIGS. 2A–F shows a MOSFET device of the present invention through the various processing steps used in the second embodiment of the present invention, i.e., in situations in which a high-k, low-temperature metal oxide is employed.

The initial structure employed in this embodiment of the present invention is shown in FIG. 2A. Specifically, FIG. 2A comprises substrate 10, isolation trenches 18 and a dummy film stack 50 which comprises a pad oxide layer 14, a polysilicon layer 52 and a $SiO_2$ layer 54. The trenches and the pad oxide layer are formed utilizing the processing steps mentioned above in connection with the first embodiment of the present invention. The polysilicon layer of dummy film stack 50 is formed utilizing conventional deposition processes such as CVD, plasma-assisted CVD and sputtering, with a low pressure CVD process being highly preferred. The thickness of polysilicon layer 52 is not critical to the present invention, but typically the thickness of the polysilicon layer is from about 1000 to about 2000 Å.

The $SiO_2$ layer of dummy film stack 50 is formed utilizing ozone deposition of tetraethylorthosilicate (TEOS), or any other deposition process which is capable of forming a $SiO_2$ layer. The thickness of $SiO_2$ layer 54 is not critical to the present invention, but typically the thickness of the $SiO_2$ layer is from about 300 to about 500 Å.

FIG. 2A also shows the presence of patterned resist 56 which is used in fabricating a dummy gate region in dummy film stack 50. The resist employed in the present invention is any conventional resist used in lithography and it is formed on the $SiO_2$ layer utilizing conventional deposition processes, exposure and development.

The patterned resist is used in the present invention to protect a portion of dummy film stack 50. The unprotected areas of dummy film stack 50 are removed stopping on pad oxide layer 14 utilizing a conventional dry etching process such as RIE or plasma etching. After removing the unprotected layers, i.e., polysilicon layer and $SiO_2$ layer 54 of the dummy film stack, the patterned resist is stripped utilizing conventional stripping techniques well known to those skilled in the art and the previously protected $SiO_2$ layer of the dummy gate region is removed utilizing a conventional wet etch process.

Figure 2B:
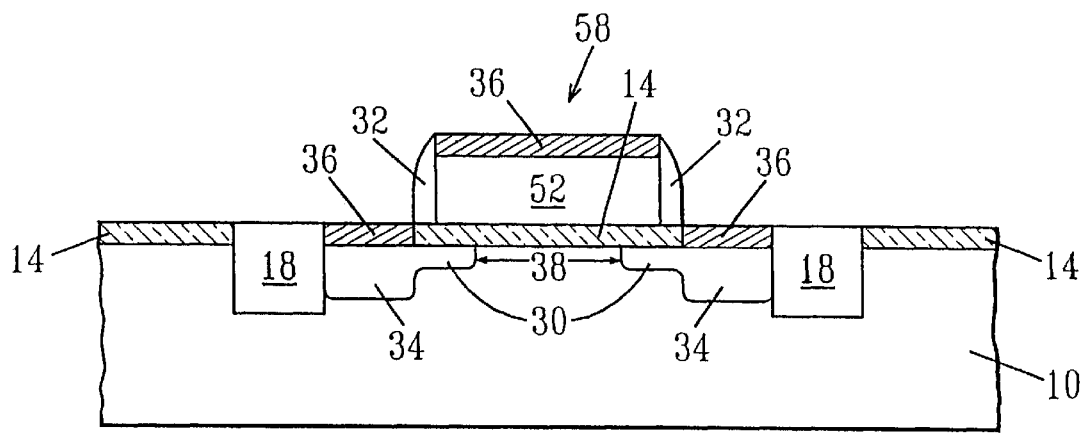

After removing the patterned resist and $SiO_2$ layer 54 from the dummy gate region, source/drain extensions 30, spacers 32, source/drain regions 34, and silicide regions 36 (over the source/drain regions and on top of the polysilicon of the dummy gate) are formed providing the structure shown in FIG. 2B. Regions 30, 32, 34 and 36 are formed utilizing the same processing techniques as mentioned hereinabove. It is noted that FIG. 2B illustrates a structure which includes a dummy gate region 58 which comprises polysilicon layer 52. The use of the dummy gate region and the subsequent formation of regions 30, 32, 34 and 36, allows one to be able to employ a high-k, low-temperature metal oxide as the gate insulator.

Figure 2C:
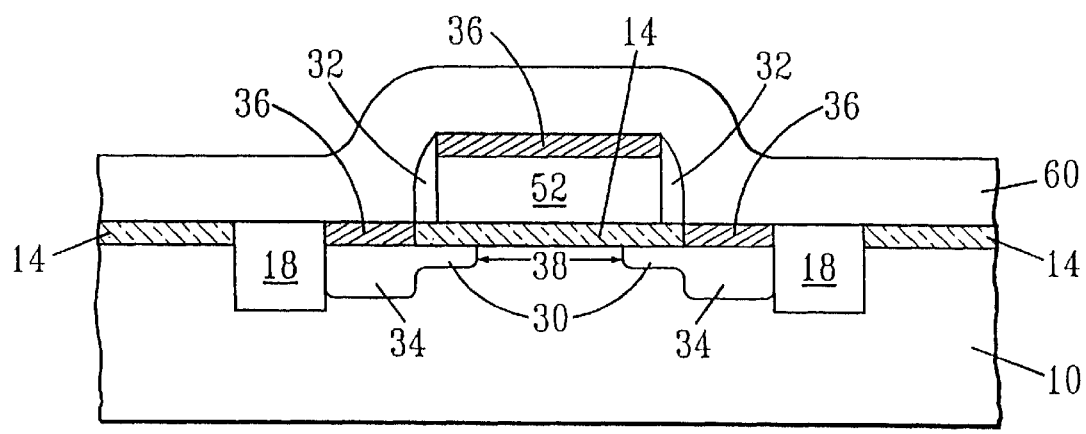

Next, as shown in FIG. 2C, an insulator layer 60 is formed over the structure utilizing conventional deposition processes such as CVD, low pressure CVD, plasma-assisted CVD and other like deposition processes that are capable of forming a conformal layer over the structure. Any insulator material such as $SiO_2$ can be employed as layer 60. The thickness of the insulator layer may vary depending upon the type of material used, but typically the thickness of the insulator layer is from about 2000 to about 3000 Å.

Figure 2D:
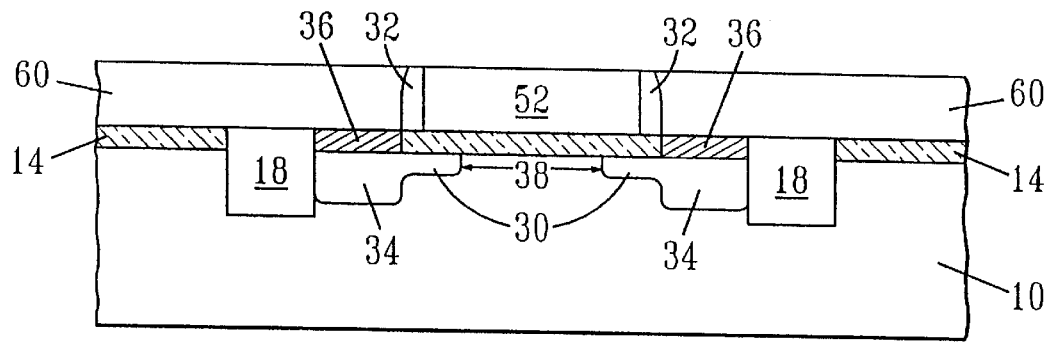
Figure 2E:
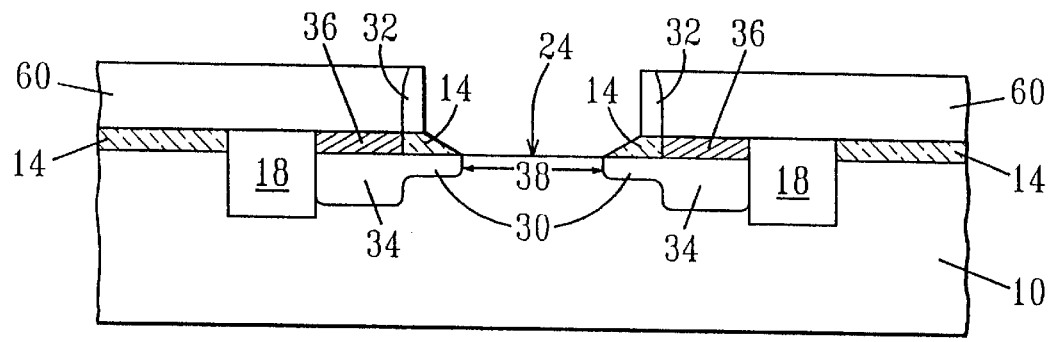

After forming the insulator layer over the structure, any conventional planarization process such as chemical-mechanical polishing or grinding may be employed. It is noted that the planarization process employed in this step of the present invention is stopped after the silicide region 36 formed on top of polysilicon layer 52 is removed. Thus, the planarization exposes polysilicon layer 52 of the dummy gate region. The structure formed after conducting the above planarization step is shown in FIG. 2D.

Next, polysilicon layer 52 is removed utilizing RIE or a chemical down stream etching process exposing pad oxide layer 14. The exposed pad oxide is then etched utilizing the COR process mentioned above so that a tapper is formed in the pad oxide layer, See FIG. 2E. The combined etch steps form opening 24 in the structure, wherein said opening contains a tapered pad oxide layer.

After forming the taper in the pad oxide layer, a high-k, low-temperature metal oxide layer 62 such as $ZrO_2$, barium titanate, strontium titanate, barium strontium titanate and the like is formed in the opening utilizing a conventional deposition process as described previously herein in connection with the high-k, high-temperature metal oxide. The thickness of the high-k, low-temperature metal oxide is from about 5 to about 30 Å.

An optional barrier layer, e.g., a nitride, may be formed in the opening prior to deposition of the high-k, low-temperature metal oxide. When an optional barrier layer is formed in the structure, any conventional deposition process such as CVD may be used and the thickness may vary depending on the type of material used in forming the barrier layer.

After forming the high-k, low-temperature metal oxide in the structure a rapid thermal anneal in $N_2$ at a temperature of about 950° C. or below and for about 30 seconds or less is employed. The rapid thermal anneal may be carried out utilizing a single ramp and soak cycle or multiple ramp and soak cycles may be employed.

A conductive material 28 such as described above is then formed in the opening utilizing the processing steps mentioned hereinabove. The structure may then be planarized by conventional planarization processes, e.g., CMP, to provide the structure shown in FIG. 2F.

Figure 2F:
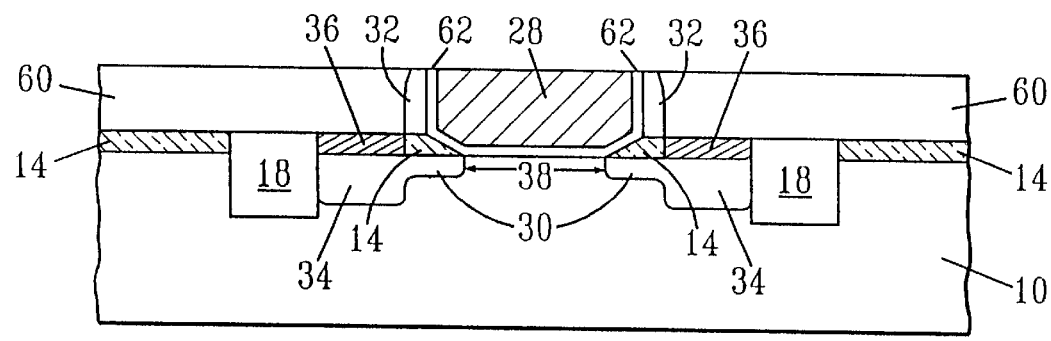

In both FIGS. 1G and 2F, there are shown MOSFET devices in which a high-k metal oxide is employed as the gate insulator. Moreover, the MOSFET devices shown in FIGS. 1G and 2F have a low overlap capacitance and a short channel length. The short channel length is a direct result of providing a taper to the pad oxide layer. By tapering the pad oxide layer in the manner described above, channel 38 is much smaller than that which can be obtained from lithographic processes.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim is new, and desire to secure by the Letters Patent is:

1. A MOSFET device comprising at least one gate region formed on a semiconductor substrate, said gate region comprising a gate conductor, a gate insulator and spacers, said gate insulator is a high-k metal oxide having a dielectric constant of greater than 7.0, said gate region further comprising a sub-lithographic channel formed beneath said gate insulator, wherein said channel length is determined by forming a portion of said gate insulator on a tapered pad oxide layer.

2. The MOSFET device of claim 1 wherein said semiconductor substrate is comprised of Si, Ge, SiGe, GaP, InAs, InP or Si/SiGe.

3. The MOSFET device of claim 1 wherein said gate conductor comprises polysilicon, W, Ta or TiN.

4. The MOSFET device of claim 1 wherein said high-k metal oxide comprises $Al_2O_3$, $TiO_2$, $ZrO_2$, barium titanate, strontium titanate or barium strontium titanate.

5. The MOSFET device of claim 1 wherein said semiconductor substrate contains dielectric filled isolation trenches adjacent to said gate region.

6. The MOSFET device of claim 1 where said spacers are comprised of an oxide or nitride.

7. The MOSFET device of claim 1 wherein source and dram regions are formed in said semiconductor substrate beneath a portion of said gate region.

8. The MOSFET device of claim 7 further comprising source/drain extensions adjoining said source and drain regions.

9. The MOSFET device of claim 1 wherein a silicide is formed atop said gate region.

10. The MOSFET device of claim 7 wherein silicide regions are formed over said source and drain regions.

* * * * *